(12) United States Patent
Shimizu et al.

(10) Patent No.: US 8,137,892 B2
(45) Date of Patent: Mar. 20, 2012

(54) PHOTOBASE GENERATOR AND PHOTOCURABLE RESIN COMPOSITION

(75) Inventors: Katsuya Shimizu, Tokyo (JP); Fumio Matsushita, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 358 days.

(21) Appl. No.: 12/518,313

(22) PCT Filed: Dec. 12, 2007

(86) PCT No.: PCT/JP2007/073916
§ 371 (c)(1),
(2), (4) Date: Jun. 9, 2009

(87) PCT Pub. No.: WO2008/072651
PCT Pub. Date: Jun. 19, 2008

(65) Prior Publication Data
US 2010/0151386 A1    Jun. 17, 2010

(30) Foreign Application Priority Data
Dec. 14, 2006 (JP) .................................. 2006-336901

(51) Int. Cl.
G03F 7/00 (2006.01)
G03F 7/004 (2006.01)
G03F 7/028 (2006.01)
G03F 7/032 (2006.01)

(52) U.S. Cl. ............... 430/270.1; 430/280.1; 430/281.1; 430/905; 430/910; 430/913; 430/919

(58) Field of Classification Search ............... 430/270.1, 430/913, 280.1, 281.1, 905, 910, 919
See application file for complete search history.

(56) References Cited

U.S. PATENT DOCUMENTS
| 3,321,520 | A | 5/1967 | Sunagawa et al. |
| 7,300,747 | B2 | 11/2007 | Okazaki et al. ............... 430/920 |
| 2007/0066702 | A1 | 3/2007 | Okazaki et al. ............... 522/160 |

FOREIGN PATENT DOCUMENTS
| JP | 46-2574 | | 1/1971 |
| JP | 48-818 | | 1/1973 |
| JP | 4-134348 | A | 5/1992 |
| JP | 10-77264 | A | 3/1998 |
| JP | 2003-20339 | A | 1/2003 |
| JP | 2003-212856 | A | 7/2003 |
| JP | 2004-43760 | A | 2/2004 |
| JP | 2004-217526 | A | 8/2004 |
| JP | 2005-264156 | A | 9/2005 |
| JP | 2006-328427 | A | 12/2006 |
| TW | I245778 | B | 12/2005 |
| WO | WO02/051905 | | 7/2002 |
| WO | WO 2005/014696 | A1 | 2/2005 |

OTHER PUBLICATIONS

Machine translation of JP 2004-043760 (no date).*
Machine translation of JP 2006-328427 (no date).*
Extended European Search Report dated Mar. 2, 2011, European Patent Application No. 07850467.7.
Yoneho Tabata, Technology of UV/EB Curing III, *CMC Publishing Co., Ltd.*; pp. 78-86, 1997.
John Barltrop et al. "Permutation Patterns and the Photogranspositions of 2-Cyanopyrroles," *J.. Chem. Soc. Chem. Commun.*, pp. 786-787, 1975.
Munio Kotake, "Non-benzenoid Aromatic Ring Compounds," *Dai-Yuki Kaguku*, vol. 13, Asakura Publishing Co., Ltd., pp. 308-353, 1957.
O.L. Chapman, "Photochemical Rearrangements of Organic Molecules," *Advances in Photochemistry*, vol. 1, pp. 323-420, 1963.
Hugh J. Anderson, "Pyrrole Chemistry," *Canadian Journal of Chemistry*, vol. 37, pp. 2053-2058, 1959.
Office Action from TW 096148130 dated Oct. 12, 2011.

* cited by examiner

*Primary Examiner* — Amanda C. Walke
(74) *Attorney, Agent, or Firm* — Morgan, Lewis & Bockius LLP

(57) ABSTRACT

Disclosed is a photobase generator comprising a compound having a nitrogen atom and a conjugated multiple bond.

9 Claims, No Drawings

PHOTOBASE GENERATOR AND PHOTOCURABLE RESIN COMPOSITION

TECHNICAL FIELD

The present invention relates to a photobase generator and a photocurable resin composition.

BACKGROUND ART

A photo-curing technique of a resin has been widely utilized especially in the field of electronic materials owing to its superiority to conventional thermal curing techniques in that curing can be conducted at a low temperature and in a short time, and further that microfabrication can be performed by photopatterning. The resin photo-curing techniques can be largely classified into three types, namely a radical type, a cationic type including an acid curing type, and an anionic type including a base curing type. Among them the photo-curing technique of the radical type has been prevailing. However, since a (meth)acrylic type polymer used in this photo-curing technique has drawbacks in that curing contraction is high, and that heat resistance and/or adhesiveness is poor, these points should be improved. Many compounds have been developed as photo acid generators to be used for the photo-curing technique of the radical type. However, all of the photo acid generators yield a strong protonic acid by photoirradiation, which can promote corrosion of metals, and further study is required for practical use in the field of electronic materials.

Meanwhile, a photo-curing technique of a base curing type using a photobase generator has been known as one of the anionic photo-curing techniques for curing an anionic curable resin by photoirradiation. As a photobase generator, a compound generating an amine by photoirradiation has been reported, and for example a derivative of carbamic acid has been studied (see Patent Document 1 and Non-Patent Document 1). An example of a photobase generator without coproducing carbon dioxide has been disclosed in Patent Documents 2, 3, and the like. Further, an example for increasing basicity by changing a 1,4-dihydropyridine skeleton to a pyridine skeleton by photoirradiation is disclosed in Patent Document 4.

Patent Document 1: Japanese Patent Laid-Open No. 10-77264
Patent Document 2: Japanese Patent Laid-Open No. 2005-264156
Patent Document 3: Japanese Patent Laid-Open No. 2003-212856
Patent Document 4: Japanese Patent Laid-Open No. 2003
Non-Patent Document 1: "Technology of UV/EB Curing III" (1997), CMC Publishing Co., Ltd., p. 78

DISCLOSURE OF THE INVENTION

Problems to be Solved by the Invention

According to the techniques disclosed in Patent Document 1 and Non-Patent Document 1, however, carbon dioxide is coproduced by exposure to light generating bubbles in the cured product, which creates a critical flaw at microfabricating. Additionally, unnecessary byproducts such as an aldehyde are generated by this technique, which deteriorate the properties of the cured product such as heat resistance and adhesiveness. Also, according to the techniques described in Patent Documents 2 and 3, unnecessary byproducts are generated, and the properties of the cured product such as heat resistance and adhesiveness are deteriorated. Furthermore, since the photobase generators used in the techniques contain an ionic component, these are hardly applicable to the use in electronic materials which requires stringently highest insulation reliability. Further, in case of technique described in Patent Document 4, since water is coproduced by photoirradiation, this technique is hardly applicable to the use in electronic materials which requires stringently highest insulation reliability.

That is, according to conventional photo-curing techniques including the aforedescribed, it is difficult to provide a photobase generator which expresses basicity, while adequately suppressing generation of unnecessary byproducts by exposure to light such as a gas or a water. It is difficult for the photo-curing techniques to respond to the stringent requirements for insulation reliability, heat resistance and microfabricability on a photocurable resin especially in the field of electronic materials.

The present invention has been made under such circumstances, with an object to provide a photobase generator suitable for curing an anionic curable resin by photoirradiation, which can express or increase basicity, while adequately suppressing generation of unnecessary byproducts by photoirradiation such as a gas and water.

Means for Solving the Problems

On the other hand, in connection with a process for producing a pharmaceutical drug having anti-inflammatory activity, it has been already known that, when aminotropone is irradiated by ultraviolet rays, an intramolecular cyclization reaction represented by the following formula (18) proceeds (e.g. Japanese Patent Publication No. 48-818).

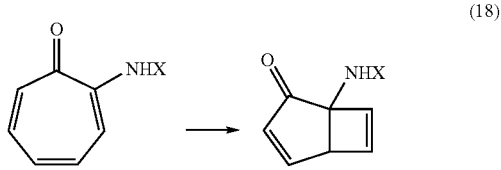

(18)

Further, J. Chem. Soc. Chem. Commun., p. 786 (1975) discloses that 2-cyanopyrrole causes an intramolecular cyclization reaction represented by the following formula (19) by irradiation of ultraviolet rays.

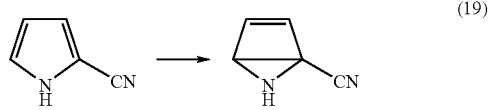

(19)

Japanese Patent Publication No. 46-2574 discloses an example, in which at least one selected from 5-phenyltropolone, 5-cyanotropolone and 2-amino-5-phenyltropone is utilized as an information recording material by irradiation of ultraviolet ray. The document further discloses that an epoxy resin may be used as a dispersing medium for the aforedescribed three compounds.

The present inventors have discovered that a photobase generator with certain characteristics or a chemical structure including the aforedescribed compounds can express or increase basicity, while adequately suppressing generation of unnecessary byproducts, thereby completing the present invention.

Namely, the present invention provides the following.

(1) A photobase generator comprising a compound having a nitrogen atom and a conjugated multiple bond.

(2) The photobase generator according to (1) above, wherein the conjugated multiple bond is a conjugated double bond.

(3) The photobase generator according to (1) or (2) above, wherein the conjugated multiple bond is shortened or vanished by photoirradiation.

(4) The photobase generator according to any one of (1) to (3) above, wherein the nitrogen atom is adjacent to the conjugated multiple bond.

(5) The photobase generator according to (4) above, wherein the compound comprises a compound represented by the following general formula (1);

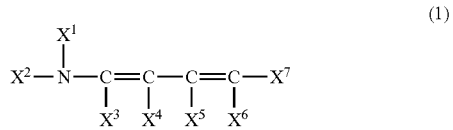
(1)

wherein $X^1$ to $X^7$ each independently represent an arbitrary atom or an atomic group, at least two of which may bond together to form a ring structure.

(6) The photobase generator according to any one of (1) to (3) above, wherein the nitrogen atom is an element of the conjugated multiple bond.

(7) The photobase generator according to (6) above, wherein the compound comprises a compound represented by the following general formula (2);

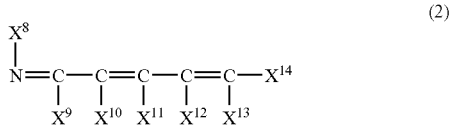
(2)

wherein $X^8$ to $X^{14}$ each independently represent an arbitrary atom or an atomic group, at least two of which may bond together to form a ring structure.

(8) The photobase generator according to any one of (1) to (7) above, wherein the compound comprises a ring structure.

(9) The photobase generator according to (8) above, wherein the ring structure is a five-membered ring structure or a seven-membered ring structure.

(10) The photobase generator according to (9) above, wherein the ring structure is a seven-membered ring structure.

(11) The photobase generator according to any one of (1) to (3) above, wherein the compound comprises at least either of compounds represented by the following general formulas (3) and (4);

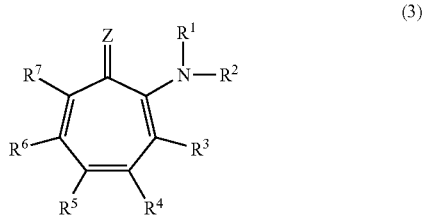
(3)

wherein $R^1$ and $R^2$ each independently represent a hydrogen atom, an alkyl group, an alkenyl group, a cycloalkyl group, an aralkyl group, or an aryl group; $R^3$, $R^4$, $R^5$, $R^6$ and $R^7$ each independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen group, or an amino group; $R^1$, $R^2$, $R^3$, $R^4$, $R^5$, $R^6$ and $R^7$, at least two of which may bond together to form a saturated or an unsaturated ring, may each independently be substituted with a monovalent group formed by removing a hydrogen atom from the compound represented by the formula (3) or (4); and Z represents an oxygen atom or a sulfur atom.

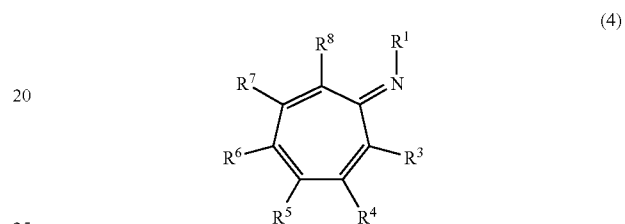
(4)

wherein $R^1$ represents a hydrogen atom, an alkyl group, a cycloalkyl group, an aralkyl group, an alkenyl group, or an aryl group; $R^3$, $R^4$, $R^5$, $R^6$, $R^7$ and $R^8$ each independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen group, or an amino group; $R^1$, $R^2$, $R^3$, $R^4$, $R^5$, $R^6$, $R^7$ and $R^8$, at least two of which may bond together to form a saturated or an unsaturated ring, may each independently be substituted with a monovalent group formed by removing a hydrogen atom from the compound represented by the formula (3) or (4).

(12) The photobase generator according to (11) above, wherein the Z represents an oxygen atom.

(13) The photobase generator according to (11) or (12) above, wherein the $R^1$, $R^2$, $R^3$, $R^4$, $R^5$, $R^6$, $R^7$ and $R^8$ each independently represent a hydrogen atom, an alkyl group, an alkenyl group, a cycloalkyl group, an aralkyl group, or an aryl group.

(14) The photobase generator according to any one of (11) to (13) above, wherein the $R^1$ and/or $R^2$ represent(s) an alkyl group, an alkenyl group, a cycloalkyl group, an aralkyl group, or an aryl group.

(15) The photobase generator according to (11) or (12) above, wherein the $R^1$ represents a methyl group, the $R^2$ represents a hydrogen atom, and the $R^3$, $R^4$, $R^5$, $R^6$, $R^7$ and $R^8$ each independently represent a hydrogen atom or an isopropyl group.

(16) A photocurable resin composition comprising 100 parts by mass of an anionic polymerizable resin; and 0.001 to 100 parts by mass of the photobase generator according to any one of (1) to (15) above.

(17) The photocurable resin composition according to (16) above, wherein the anionic polymerizable resin is an epoxy resin.

(18) The photocurable resin composition according to (17) above, further comprising a polythiol.

(19) The photocurable resin composition according to (17) or (18) above, further comprising a phenolic resin.

Advantages of the Invention

The present invention can provide a photobase generator suitable for curing an anionic curable resin by photoirradiation, which can express or increase basicity, while adequately suppressing generation of unnecessary byproducts by photoirradiation such as a gas and water.

BEST MODE FOR CARRYING OUT THE INVENTION

Hereinafter, best modes for carrying out the present invention (hereinafter referred to briefly as an "Embodiment") will be explained in detail, provided that the present invention is not limited to the following embodiments and variations may be made without departing from the spirit of the invention. Further, the term "(meth)acrylate" means herein "an acrylate and the corresponding methacrylate".

It is an essential condition that the photobase generator of the Embodiment comprises a compound with a nitrogen atom and a conjugated multiple bond. The photobase generator can express basicity without producing unnecessary byproducts such as a gas or a water, only when such a precondition is satisfied. As the result, the Embodiment can provide a photobase generator especially suitable for curing a resin for an electronic material, which requires high degree of insulation reliability, heat resistance and micro-fabricability; and a photocurable resin composition containing the photobase generator.

The term "photobase generator" means herein a compound which expresses or increases basicity by photoirradiation. Further, the term "basicity" means a capacity for curing a resin that is cured by a base. Whether a resin is cured or not can be verified by increase in the degree of polymerization, increase in the degree of cross-linking, decrease in solubility in a specific liquid (such as an aqueous alkali solution or an organic solvent), or the like.

Furthermore, the expression or increase of the basicity of the photobase generator by photoirradiation can be verified as follows. Namely, a photobase generator or a solution thereof is prepared, and the pH of the same at room temperature is measured. The light with a specific wavelength (e.g. ultraviolet rays with the wavelength of 365 nm) is irradiated on the photobase generator or the solution thereof to a predetermined light quantity (e.g. 6 to 9 J/cm$^2$), and then the pH of the photobase generator or the solution thereof at room temperature is measured. As a result, if the pH before the photoirradiation is 7.0 or lower and the pH after the photoirradiation is beyond 7.0, the basicity is deemed to be expressed. If the pH before the photoirradiation is beyond 7.0 and the pH after the photoirradiation is higher than the pH before the photoirradiation, the basicity is deemed to be increased. In other cases, the basicity is confirmed as neither expressed nor increased. For measurement of the pH, the photobase generator or the solution thereof may be diluted with pure water or ion exchanged water as needed, and a commercially available pH meter (e.g. Trade name "HM-30G" manufactured by DKK-TOA Corporation) may be used for measurement.

There are no particular restrictions on the photobase generator of the Embodiment, insofar as it includes a compound with a nitrogen atom and a conjugated multiple bond system. In view of high efficiency in expressing the basicity, the photobase generator preferably includes a compound, whose conjugated multiple bond is shortened or vanished by photoirradiation.

Examples of a compound, whose conjugated multiple bond system is shortened or vanished by photoirradiation, may include a compound with a nitrogen atom adjacent to the conjugated multiple bond, and a compound with a nitrogen atom being an element of the conjugated multiple bond. More specific examples may include those causing reactions for shortening or vanishing the conjugated multiple bond by photoirradiation according to the following reaction formulas (5) to (12), but not limited thereto.

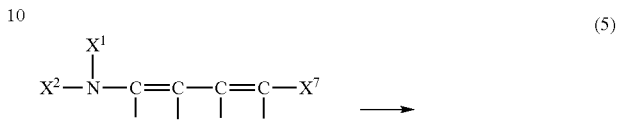

(5)

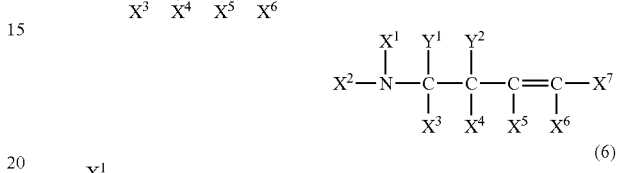

(6)

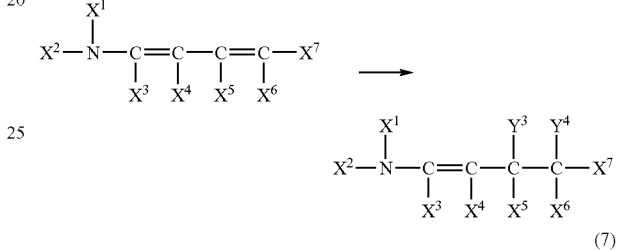

(7)

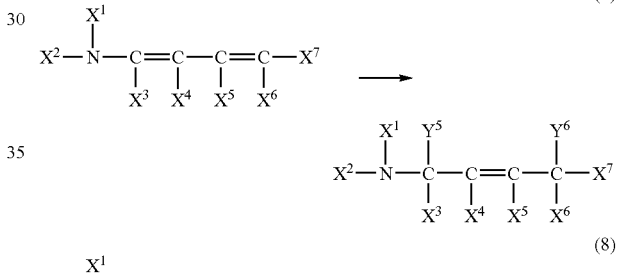

(8)

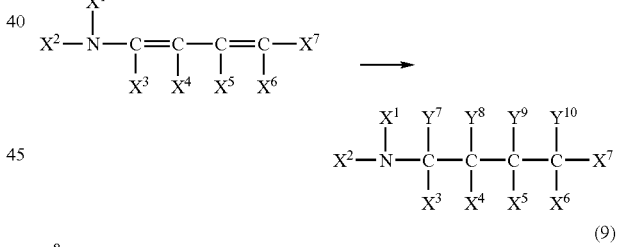

(9)

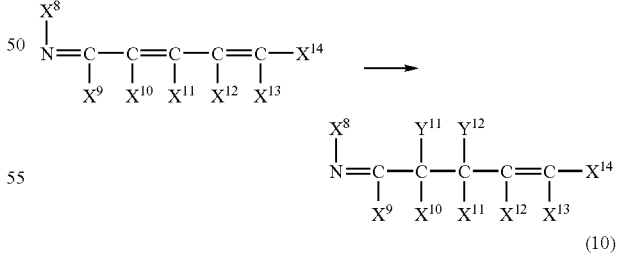

(10)

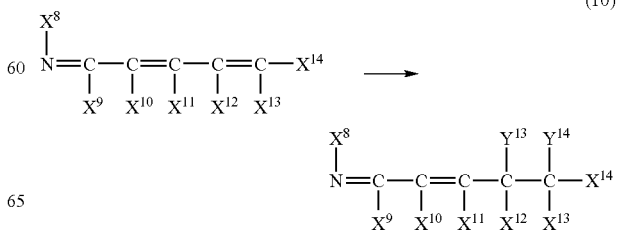

-continued

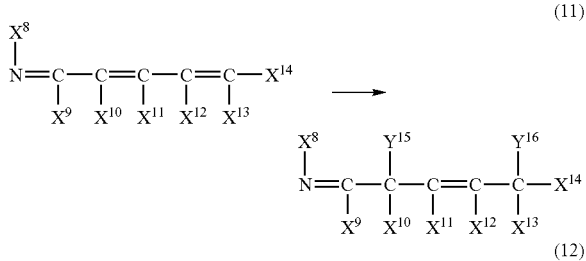
(11)

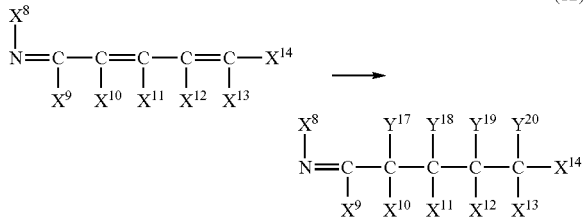
(12)

In the above formulas (5) to (12), $X^1$, $X^2$, $X^3$, $X^4$, $X^5$, $X^6$, $X^7$, $X^8$, $X^9$, $X^{10}$, $X^{11}$, $X^{12}$, $X^{13}$ and $X^{14}$ (hereinafter notated as "$X^1$ to $X^{14}$", ditto with other symbols), as well as $Y^1$ to $Y^{20}$ represent the same or different arbitrary atoms or atom groups, at least two of which may bond together to form a ring. Preferable examples of the reactions represented by the above formulas (5) to (12) may include those, in which at least two of $Y^1$ and $Y^2$, $Y^3$ and $Y^4$, $Y^5$ and $Y^6$, and $Y^7$ to $Y^{10}$, as well as at least two of $Y^{11}$ and $Y^{12}$, $Y^{13}$ and $Y^{14}$, $Y^{15}$ and $Y^{16}$, and $Y^{17}$ to $Y^{20}$ respectively bond together directly or through an organic group represented by a hydrocarbon group to form rings. Alternatively, $Y^1$ to $Y^{20}$ may be a monovalent substituent derived from components of a composition comprising a photobase generator as represented by a photocurable resin composition.

The reactions represented by the formulas (5) to (12) may be an intramolecular reaction or an intermolecular reaction. In the case of an intermolecular reaction, the reaction is not limited to a reaction between similar molecules, but may be a reaction between different types of molecules.

Although the multiple bond in the reactions represented by the formulas (5) to (12) is a double bond, it may be a reaction by which a conjugated system with a triple bond as the multiple bond is shortened or vanished.

For the photobase generator of the Embodiment, the compound preferably has a ring structure in view of improving the curability of an anionic polymerizable resin, and further preferably has a five-membered ring structure or a seven-membered ring structure.

More preferable examples of the compound having a nitrogen atom and a conjugated multiple bond to be included in the photobase generator of the Embodiment may include the compounds represented by the formulas (1) and (2) above. In the compound represented by the formula (1), firstly, $X^1$ and $X^2$ in the formula (1) are preferably independently substituents corresponding to $R^1$ and $R^2$ in the formula (3); $X^4$ to $X^6$ are preferably independently substituents corresponding to $R^3$ to $R^5$ in the formula (3); and $X^3$ and $X^7$ preferably bond together directly or through an organic group represented by a hydrocarbon group to form a ring, where more preferably a substituent corresponding to Z in the formula (3) is present in the ring. In the compound represented by the formula (1), secondly, $X^1$ in the formula (1) is preferably a substituent corresponding to $R^9$ in the formula (16) as undermentioned; $X^3$ to $X^6$ are preferably independently substituents corresponding to $R^{10}$ to $R^{13}$ in the formula (16); and $X^2$ and $X^7$ preferably bond together directly or through an organic group represented by a hydrocarbon group to form a ring. In the compound represented by the formula (2), $X^8$ in the formula (2) is preferably a substituent corresponding to $R^1$ in the formula (4); $X^{10}$ to $X^{13}$ are preferably independently substituents corresponding to $R^3$ to $R^6$ in the formula (4); and $X^9$ and $X^{14}$ preferably bond together directly or through an organic group represented by a hydrocarbon group to form a ring.

The preferable examples of compounds whose conjugated multiple bond is shortened or vanished by photoirradiation may include the compounds represented by the formulas (3) and (4). Such compounds can be synthesized by a known method. For example, various compounds can be synthesized by applying the method described in "Comprehensive Organic Chemistry (Dai-Yuki Kagaku), vol. 13: Non-benzenoid Aromatic Ring Compounds" (edited by Munio Kotake, Asakura Publishing Co., Ltd., 1957). Among them, a method including tosylating a hydroxy group in tropolones by p-toluenesulfonyl chloride, or methyl-etherifying the same by diazomethane, dimethyl sulfate or the like, followed by reacting the product with various amines, is convenient.

In the formula (3), $R^1$ and $R^2$ independently represent a hydrogen atom, an alkyl group, an alkenyl group, a cycloalkyl group, an aralkyl group, or an aryl group. $R^3$ to $R^7$ independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, a mercapto group, an alkylthioether group, an aryl group, a hydroxy group, an alkoxy group, a halogen atom, or an amino group. Examples of an alkoxycarbonyl group may include a methoxycarbonyl group, an ethoxycarbonyl group, and a hydroxyethoxycarbonyl group. Among them, a methoxycarbonyl group is preferable in view of the easiness for production. As an acyl group, an acetyl group is preferable in view of the easiness for production. Examples of an alkyl group may include a methyl group, an ethyl group, a propyl group, an isopropyl group, a butyl group, an isobutyl group, and a tert-butyl group. Among them, an isopropyl group is preferable in view of easy availability of the source material and the performance. Examples of an alkenyl group may include a propenyl group, a butenyl group and an isobutenyl group. Examples of a cycloalkyl group may include a cyclohexyl group. Examples of an aralkyl group may include a benzyl group. As an aryl group, a phenyl group is preferable in view of the easiness for production. Examples of an alkoxy group may include a methoxy group, an ethoxy group, and a propoxy group. Among them, a methoxy group is preferable in view of the easiness for production. As a halogen atom, a chlorine atom or a bromine atom is preferable in view of the easiness for production. An amino group may be substituted or unsubstituted. Examples of a mono-substituted amino group may include a methylamino group, an ethylamino group, a propylamino group, an isopropylamino group, a butylamino group, an isobutylamino group, a cyclohexylamino group, a benzylamino group, and a phenylamino group. Among them, a methylamino group is preferable in view of easy availability of the source material. Examples of a di-substituted amino group may include a dimethylamino group, a diethylamino group, a diisopropylamino group, a dibutylamino group, a diisobutylamino group, a dicyclohexylamino group, a dibenzylamino group, a diphenylamino group, a pyrrolidino group, a piperidino group, and a morpholino group. Among them, a dimethylamino group is preferable in view of easy availability of the source material.

In the formula (3), at least two of $R^1$ to $R^7$ may bond together to form a saturated or an unsaturated ring. Examples of a saturated and an unsaturated ring may include azole rings, such as a pyrazole ring, an isoxazole ring, an isothiazole ring, an imidazole ring, an oxazole ring, a thiazole ring, a triazole ring and a tetrazole ring. Further, $R^1$ to $R^7$ may independently be substituted with a monovalent group formed by removing a hydrogen atom from the compound represented by the formula (3) or (4). Z represents an oxygen atom or a sulfur atom. Z is preferably an oxygen atom in view of improving the preservation stability of the photobase generator.

In the formula (3), the exemplified above for $R^1$ to $R^7$ and Z may be combined in any manners.

In the formula (4), $R^1$ represents a hydrogen atom, an alkyl group, an alkenyl group, a cycloalkyl group, an aralkyl group, or an aryl group. $R^3$ to $R^8$ independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen atom, or an amino group. Examples of an alkoxycarbonyl group may include a methoxycarbonyl group, an ethoxycarbonyl group, and a hydroxyethoxycarbonyl group. Among them, a methoxycarbonyl group is preferable in view of the easiness for production. As an acyl group, an acetyl group is preferable in view of the easiness for production. Examples of an alkyl group may include a methyl group, an ethyl group, a propyl group, an isopropyl group, a butyl group, an isobutyl group, and a tert-butyl group. Among them, an isopropyl group is preferable in view of easy availability of the source material and the performance. Examples of an alkenyl group may include a propenyl group, a butenyl group and an isobutenyl group. Examples of a cycloalkyl group may include a cyclohexyl group. Examples of an aralkyl group may include a benzyl group. As an aryl group, a phenyl group is preferable in view of the easiness for production. Examples of an alkoxy group may include a methoxy group, an ethoxy group, and a propoxy group. Among them, a methoxy group is preferable in view of the easiness for production. As a halogen atom, a chlorine atom or a bromine atom is preferable in view of the easiness for production. An amino group may be substituted or unsubstituted. Examples of a mono-substituted amino group may include a methylamino group, an ethylamino group, a propylamino group, an isopropylamino group, a butylamino group, an isobutylamino group, a cyclohexylamino group, a benzylamino group, and a phenylamino group. Among them, a methylamino group is preferable in view of easy availability of the source material. Examples of a di-substituted amino group may include a dimethylamino group, a diethylamino group, a diisopropylamino group, a dibutylamino group, a diisobutylamino group, a dicyclohexylamino group, a dibenzylamino group, a diphenylamino group, a pyrrolidino group, a piperidino group, and a morpholino group. Among them, a dimethylamino group is preferable in view of easy availability of the source material.

In the formula (4) at least two of $R^1$ to $R^8$ may bond together to form a saturated or an unsaturated ring. Examples of a saturated and an unsaturated ring may include azole rings, such as a pyrazole ring, an isoxazole ring, an isothiazole ring, an imidazole ring, an oxazole ring, a thiazole ring, a triazole ring and a tetrazole ring. Further, $R^1$ to $R^8$ may independently be substituted with a monovalent group formed by removing a hydrogen atom from the compound represented by the formula (3) or (4).

In the formula (4), the exemplified above for $R^1$ to $R^8$ may be combined in any manners.

In the formulas (3) and (4), $R^1$ to $R^8$ preferably independently represent a hydrogen atom, an alkyl group, an alkenyl group, a cycloalkyl group, an aralkyl group, or an aryl group. Such compounds are superior in preservation stability, and therefore suitable for a photobase generator. From the same viewpoint, among them, more preferably $R^1$ and/or $R^2$ represent(s) an alkyl group, an alkenyl group, a cycloalkyl group, an aralkyl group, or an aryl group; and more preferably $R^1$ represents a methyl group, $R^2$ represents a hydrogen atom, and $R^3$ to $R^8$ independently represent a hydrogen atom or an isopropyl group.

With the compounds represented by the formulas (3) and (4), the basicity can be expressed or increased by taking advantage of the photoinduced intramolecular cyclization reaction which is characteristic of a seven-membered ring. Namely, by a photoinduced intramolecular cyclization reaction represented by the formulas (13) and (14), a conjugated system of multiple bonds extended over the entire seven-membered ring is shortened, and the electron density at the nitrogen atom is increased to express or increase the basicity.

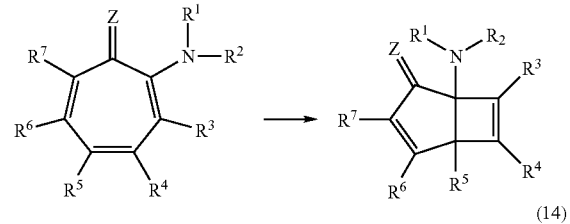

(13)

(14)

It has been known that such photoinduced intramolecular cyclization reactions take place in a seven-membered ring (see for example: O. L. Chapman, Advances in Photochemistry, vol. 1, p. 323 (1963)). In addition thereto, similar reactions have been observed in various molecules, irrespective of types of substituents of the seven-membered ring. However the concept of utilizing the reaction for expressing the basicity has not been reported.

In the case where $R^2$ in the formula (3) is a hydrogen atom, and $R^8$ in the formula (4) is a hydroxy group or a mercapto group, the chemical structures represented by the formulas (3) and (4) are in the tautomeric relation as expressed by the formula (15), and the two chemical structures are equivalents.

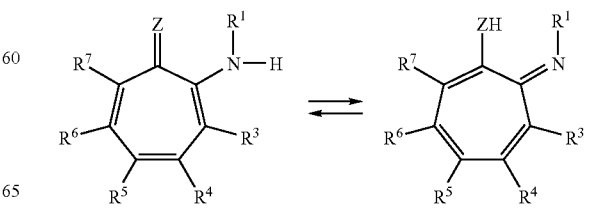

(15)

As another favorable compound whose conjugated multiple bond is shortened or vanished by photoirradiation, examples thereof may include a compound represented by the following general formula (16). The compound can be synthesized by a publicly known method, for example as disclosed in Canad. J. Chem., vol. 37, p. 2053 (1959).

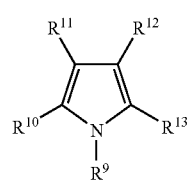
(16)

In the formula (16), $R^9$ represents a hydrogen atom, an alkyl group, an alkenyl group, a cycloalkyl group, an aralkyl group, or an aryl group. $R^{10}$ to $R^{13}$ each independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen atom, or an amino group. Examples of an alkoxycarbonyl group may include a methoxycarbonyl group, an ethoxycarbonyl group, and a hydroxyethoxycarbonyl group. Among them, a methoxycarbonyl group is preferable in view of the easiness for production. As an acyl group, an acetyl group is preferable in view of the easiness for production. Examples of an alkyl group may include a methyl group, an ethyl group, a propyl group, an isopropyl group, a butyl group, an isobutyl group, and a tert-butyl group. Among them, an isopropyl group is preferable in view of easy availability of the source material and the performance. Examples of an alkenyl group may include a propenyl group, a butenyl group, and an isobutenyl group. Examples of a cycloalkyl group may include a cyclohexyl group. Examples of an aralkyl group may include a benzyl group. As an aryl group, a phenyl group is preferable in view of the easiness for production. Examples of an alkoxy group may include a methoxy group, an ethoxy group, and a propoxy group. Among them, a methoxy group is preferable in view of the easiness for production. As a halogen atom, a chlorine atom or a bromine atom is preferable in view of the easiness for production. An amino group may be substituted or unsubstituted. Examples of a mono-substituted amino group may include a methylamino group, an ethylamino group, a propylamino group, an isopropylamino group, a butylamino group, an isobutylamino group, a cyclohexylamino group, a benzylamino group, and a phenylamino group. Among them, a methylamino group is preferable in view of easy availability of the source material. Examples of a di-substituted amino group may include a dimethylamino group, a diethylamino group, a diisopropylamino group, a dibutylamino group, a diisobutylamino group, a dicyclohexylamino group, a dibenzylamino group, a diphenylamino group, a pyrrolidino group, a piperidino group, and a morpholino group. Among them, a dimethylamino group is preferable in view of easy availability of the source material.

In the formula (16), at least two of $R^9$ to $R^{13}$ may bond together to form a saturated or an unsaturated ring. As a saturated or an unsaturated ring, azole rings, such as a pyrazole ring, an isoxazole ring, an isothiazole ring, an imidazole ring, an oxazole ring, a thiazole ring, a triazole ring and a tetrazole ring, may be exemplified. Further $R^9$ to $R^{13}$ may each independently be substituted with a monovalent group formed by removing a hydrogen atom from the compound represented by the formula (16).

With the compounds represented by the formula (16), the basicity can be expressed or increased by taking advantage of the photoinduced intramolecular cyclization reaction characteristic of pyrrole. Namely, by a photoinduced intramolecular cyclization reaction represented by the formula (17), a conjugated system of multiple bonds extended over the entire five-membered ring is shortened, and the electron density at the nitrogen atom is increased to express or increase the basicity.

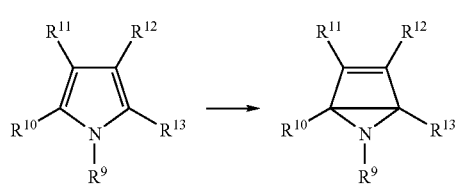
(17)

For the photobase generator of the Embodiment, the aforedescribed compounds may be used alone or in combination of two or more.

Next, the photocurable resin composition of the Embodiment will be described below. The photocurable resin composition includes an anionic polymerizable resin and the aforedescribed photobase generator. The photobase generators are used alone or in combination of two or more.

There are no particular restrictions on the anionic polymerizable resin of the Embodiment, insofar as the resin can cure by a base. Examples of the resin may include an epoxy resin, a precursor of polyimide and a compound having an isocyanate group. Among them, an epoxy resin is preferable in view of overall performance and economy.

Publicly known epoxy resins may be used, and examples thereof may include glycidyl ether type epoxy resins, such as a glycidyl ether with a dihydric phenol, a polyglycidyl ether with a polyhydric phenol having 3 to 6 or more hydroxy groups, a diglycidyl ether with an aliphatic dihydric alcohol, and a polyglycidyl ether with an aliphatic polyhydric alcohol having 3 to 6 or more hydroxy groups; glycidyl ester type epoxy resins; a glycidyl ester with an aliphatic or an alicyclic polycarboxylic acid; a glycidyl amine with an aromatic amine having an active hydrogen atom; a glycidyl amine with an alicyclic amine having an active hydrogen atom; a glycidyl amine with a heterocyclic amine having an active hydrogen atom; a chain aliphatic epoxide and an alicyclic epoxide.

Among these, examples of glycidyl ether with a dihydric phenol may include bisphenol F-diglycidyl ether, bisphenol A-diglycidyl ether, bisphenol S-diglycidyl ether, halogenated bisphenol A-diglycidyl ether, tetrachlorobisphenol A-diglycidyl ether, catechin diglycidyl ether, resorcinol diglycidyl ether, hydroquinone diglycidyl ether, 1,5-dihydroxynaphthalene diglycidyl ether, dihydroxybiphenyl diglycidyl ether, octachloro-4,4'-dihydroxyphenyl diglycidyl ether, tetramethylbiphenyl diglycidyl ether, 9,9'-bis(4-hydroxyphenyl)fluorene diglycidyl ether, and a diglycidyl ether obtained by reacting 2 mols of bisphenol A and 3 mols of epichlorohydrin.

Examples of a polyglycidyl ether with a polyhydric phenol having 3 to 6 or more hydroxy groups may include pyrogallol triglycidyl ether, dihydroxynaphthyl cresol triglycidyl ether, tris(hydroxyphenyl)methane triglycidyl ether, dinaphthyl triglycidyl ether, tetrakis(4-hydroxyphenyl)ethane tetraglycidyl ether, p-glycidylphenyldimethyltolyl bisphenol A glycidyl ether, trismethyl-tert-butyl-butylhydroxymethane triglycidyl ether, 4,4'-oxybis(1,4-phenylethyl)tetracresol glycidyl ether, 4,4'-oxybis(1,4-phenylethyl)phenyl glycidyl ether, bis(dihydroxynaphthalene) tetraglycidyl ether, a glycidyl ether with a phenol or cresol novolak resin, a glycidyl ether with a limonene phenol novolak resin, a polyglycidyl ether with a polyphenol obtained by a condensation reaction of phenol with glyoxal, glutaraldehyde, or formaldehyde, and a polyglycidyl ether with a polyphenol obtained by a condensation reaction of resorcin with acetone.

Examples of a diglycidyl ether with an aliphatic dihydric alcohol may include ethylene glycol diglycidyl ether, propylene glycol diglycidyl ether, tetramethylene glycol diglycidyl ether, 1,6-hexanediol diglycidyl ether, polyethylene glycol diglycidyl ether, polypropylene glycol diglycidyl ether, polytetramethylene glycol diglycidyl ether, neopentyl glycol diglycidyl ether, and a diglycidyl ether with an addition product of bisphenol-A and an alkylene oxide (ethylene oxide or propylene oxide).

Examples of a polyglycidyl ether with an aliphatic polyhydric alcohol having 3 to 6 or more hydroxy groups may include trimethylolpropane triglycidyl ether, glycerol triglycidyl ether, pentaerythritol tetraglycidyl ether, sorbitol hexaglycidyl ether, and polyglycerol polyglycidyl ether.

Examples of glycidyl ester type epoxy resins may include a glycidyl ester with an aromatic polycarboxylic acid, such as phthalic acid diglycidyl ester, isophthalic acid diglycidyl ester, terephthalic acid diglycidyl ester and trimellitic acid triglycidyl ester. Examples of a glycidyl ester with an aliphatic or alicyclic polycarboxylic acid may include a glycidyl ester with an aromatic polycarboxylic acid whose aromatic nucleus is hydrogenated, dimer acid diglycidyl ester, diglycidyl oxalate, diglycidyl maleate, diglycidyl succinate, diglycidyl glutarate, diglycidyl adipate, diglycidyl pimelate, a glycidyl (meth)acrylate (co)polymer and tricarballylic acid triglycidyl ester.

Examples of a glycidyl amine with an aromatic amine having an active hydrogen atom may include N,N-diglycidyl toluidine, N,N,N',N'-tetraglycidyl diamino diphenyl methane, N,N,N',N'-tetraglycidyl diamino diphenylsulfone, N,N,N',N'-tetraglycidyl diethyl diphenyl methane, and N,N,O-triglycidyl aminophenol. Examples of a glycidyl amine with an alicyclic amine having an active hydrogen atom may include hydrogenated N,N,N',N'-tetraglycidyl xylylenediamine. Examples of a glycidyl amine with a heterocyclic amine having an active hydrogen atom may include trisglycidyl melamine.

Examples of a chain aliphatic epoxide may include epoxidized butadiene and epoxidized soybean oil. Examples of an alicyclic epoxide may include vinylcyclohexene dioxide, limonene dioxide, dicyclopentadiene dioxide, bis(2,3-epoxycyclopentyl)ether, ethylene glycol bisepoxydicyclopentyl ether, 3,4-epoxy-6-methylcyclohexylmethyl-3',4'-epoxy-6'-methylcyclohexane carboxylate, bis(3,4-epoxy-6-methylcyclohexylmethyl) adipate, and bis(3,4-epoxy-6-methylcyclohexylmethyl)butylamine.

The epoxy resins of the Embodiment may be used alone or in combination of two or more. The epoxy resin is preferably a glycidyl ether type epoxy resin or a glycidyl ester type epoxy resin, in view of the cured product performance and easy availability, and more preferably a glycidyl ether type epoxy resin.

In the case where the anionic polymerizable resin is an epoxy resin, the photocurable resin composition preferably comprises additionally a compound having two or more functional groups which is reactive with an epoxy resin in the molecule. This can further increase the curability of the photocurable resin composition. There is no particular restriction on the functional group reactive with an epoxy resin, insofar as the functional group is known to react with an epoxy resin, and examples thereof may include a carboxyl group, a thiol group, a phenolic hydroxy group, and a primary or secondary aromatic amino group. Among them, a thiol group and/or a phenolic hydroxy group is preferable in view of high reactivity.

There is no particular restriction on the compound having two or more thiol groups, namely a polythiol, insofar as it is publicly known, and examples thereof may include a C1 to C20 alkylthiol compound having 2 to 6 or even more functional groups. Examples of such alkylthiol compound may include 1,4-butane dithiol and 1,8-octane dithiol. Examples of other compounds having thiol groups may include a thiol obtained by reacting a polyepoxide and hydrogen sulfide; and an esterified product between a C2 to C20 mercaptocarboxylic acid having 2 to 3 or even more functional groups (such as mercaptoacetic acid, mercaptopropionic acid, mercaptobutyric acid, mercaptohexanoic acid, mercaptooctanoic acid, and mercaptostearic acid) and a C2 to C30 polyol having 2 to 6 functional groups. Among them, the esterified product between the above mercaptocarboxylic acid and the above polyol is preferable in view of the cured product performance and easy availability.

There is no particular restriction on the compound having a phenolic hydroxy group, insofar as it is publicly known. Examples thereof may include a phenolic resin, such as a novolac resin and a resol resin. Among them, a novolac resin is more preferable in view of the cured product performance. Examples of a novolac resin may include a phenol novolac resin and a cresol novolac resin. Among them, a cresol novolac resin is more preferable in view of the cured product performance.

In the photocurable resin composition of the Embodiment, a compound having, in the molecule, two or more functional groups which is reactive with an epoxy resin is preferably contained at a ratio of 0.5/1.5 to 1.5/0.5 with respect to the epoxy resin according to (total amount of the functional group)/(total amount of the epoxy group in the epoxy resin) (by equivalent), and more preferably at a ratio of 0.8/1.2 to 1.2/0.8. When the photocurable resin composition contains the compound at the specified ratio, the curability tends to be improved further.

The precursor of polyimide may be used alone or in combination of two or more precursors synthesized independently, and a polyamic acid is favorably used. Since a polyamic acid can be produced by mixing an acid dianhydride and diamine in a solution, it can be synthesized in a single step reaction. Therefore it is advantageously available at a low cost owing to the simple synthesis.

When an application where the requirements on the heat resistance and the dimensional stability of the final product polyimide are stringent, the precursor of polyimide is preferably an all-aromatic polyimide precursor which has a moiety of an aromatic structure derived from an acid dianhydride, and which has a moiety of an aromatic structure derived from a diamine. That is, a moiety derived from a diamine preferably has a structure derived from an aromatic diamine.

As used herein, the term "an all-aromatic polyimide precursor" means a polyimide precursor to be obtained by copolymerization of an aromatic acid component and an aromatic amine component, or by polymerization of an aromatic acid/an aromatic amine component, and derivatives thereof. Further, the term "an aromatic acid component" means a compound whose four acid radicals forming a polyimide skeleton are entirely introduced onto an aromatic ring, and the term "an aromatic amine component" means a compound whose two amino groups forming a polyimide skeleton are both introduced onto an aromatic ring. Furthermore, the term "an aromatic acid/aromatic amine component" means acid radicals and amino groups forming a polyimide skeleton are entirely introduced onto an aromatic ring. As obvious from the specific examples of source materials described below, the entire acid radicals and amino groups may be present on the same aromatic ring or on different aromatic rings.

As a method for producing a polyimide precursor, a conventionally publicly known method may be applicable. For example, it may be a method for synthesizing a polyamide acid as a precursor from an acid dianhydride and a diamine. Alternatively, it may be a method for synthesizing a polyimide precursor by producing a carboxylic acid, such as an ester acid or an amide acid monomer to be obtained by reacting an acid dianhydride with a monohydric alcohol, an amino compound or an epoxy compound; and then reacting the carboxylic acid with a diamino compound or a derivative thereof. However, a production method for a polyimide precursor is not limited to the foregoing.

Examples of an acid dianhydride applicable to the production of a polyimide precursor may include ethylene tetracarboxylic acid dianhydride, butane tetracarboxylic dianhydride, cyclobutane tetracarboxylic dianhydride, cyclopentane tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyl tetracarboxylic dianhydride, 2,2',3,3'-biphenyl tetracarboxylic dianhydride, 2,2',6,6'-biphenyl tetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexaflupropane dianhydride, 2,2-bis{4-[3-(1,2-dicarboxy)phenoxy]phenyl}-1,1,1,3,3,3-propane dianhydride, 2,3,6,7-naphthalenetetracarboxylic dianhydride, 1,4,5,8-naphthalenetetracarboxylic dianhydride, 1,2,5,6-naphthalene tetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, and 1,2,7,8-phenanthrenetetracarboxylic dianhydride. These may be used alone or in mixture of two or more kinds.

As a tetracarboxylic dianhydride especially favorably used are exemplified pyromellitic dianhydride, 3,3',4,4'-benzophenone tetracarboxylic dianhydride, 3,3',4,4'-biphenyl tetracarboxylic dianhydride, 2,2',6,6'-biphenyl tetracarboxylic dianhydride, bis(3,4-dicarboxyphenyl)ether dianhydride, and 2,2-bis(3,4-dicarboxyphenyl)-1,1,1,3,3,3-hexafluoropropane dianhydride.

When an acid dianhydride introduced with fluorine or an acid dianhydride with an alicyclic skeleton is used as an acid dianhydride in addition to the above-mentioned, the transparency of a polyimide precursor can be improved.

When a rigid acid dianhydride, such as pyromellitic dianhydride, 3,3',4,4'-biphenyl tetracarboxylic dianhydride, and 1,4,5,8-naphthalenetetracarboxylic dianhydride, is used, the linear thermal expansion coefficient of a final polyimide product can be decreased.

Diamine as the amine component may be also used alone or in mixture of two or more kinds.

There in no particular restriction on diamine as the amine component, and examples thereof may include p-phenylenediamine, m-phenylenediamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenyl methane, 4,4'-diaminodiphenyl methane, 3,4'-diaminodiphenyl methane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino- α,α-dimethylbenzyl)phenoxy]benzophenone, 4,4'-bis[4-(4-amino-α,α-dimethylbenzyl)phenoxy]diphenyl sulfone, 4,4'-bis[4-(4-aminophenoxy)phenoxy]diphenyl sulfone, 3,3'-diamino-4,4'-diphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindan, 6,6'-bis(4-aminophenoxy)-3,3,3',3'-tetramethyl-1,1'-spirobiindan, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis[2-(2-aminomethoxy)ethyl]ether, bis[2-(2-aminoethoxy)ethyl]ether, bis[2-(3-aminoprotoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)bicyclo[2.2.1]heptane.

Diamines derived from the above-mentioned diamines by substituting a part or all of hydrogen atoms on the aromatic rings with one or more kinds of substituents selected from the group consisting of a fluoro group, a methyl group, a methoxy group, a trifluoromethyl group and a trifluoromethoxy group, may be also used.

Further, depending on a purpose, one or more kinds selected from the group consisting of an ethynyl group, a benzocyclobuten-4'-yl group, a vinyl group, an allyl group, a cyano group, an isocyanate group and an isopropenyl group may be introduced substituting a part or all of hydrogen atoms on an aromatic ring of the diamines as a cross-linking point.

The diamine may be selected depending on aiming properties. In the case where a rigid diamine such as p-phenylenediamine is selected, the expansion coefficient of the final product polyimide becomes low. Examples of the rigid diamine may include a diamine having 2 amino groups bonded to the same aromatic ring. Specific examples thereof may include p-phenylenediamine, m-phenylenediamine, 1,4-diaminonaphthalene, 1,5-diaminonaphthalene, 2,6-diaminonaphthalene, 2,7-diaminonaphthalene and 1,4-diaminoanthracene.

A diamine, in which two or more aromatic rings are bonded by a single bond and two or more amino groups are bonded to different aromatic rings directly or as a part of a substituent, may be also used. Examples of the diamine may include benzidine.

In the case where the final product polyimide is used for an optical waveguide or an optical circuit component, the transmittance of an electromagnetic wave with the wavelength of 1 μm or longer can be improved by introducing fluorine as a substituent to the aromatic ring.

Meanwhile, in the case where a diamine with a siloxane skeleton, for example 1,3-bis(3-aminopropyl)tetramethyl disiloxane, is used, the elastic modulus of the final product polyimide is lowered and the glass transition temperature can be lowered.

A diamine to be selected is preferably an aromatic diamine in view of the heat resistance. However, in accordance with aiming properties, no more than 60 mol %, more preferably no more than 40 mol % in terms of total diamine may be a diamine other than aromatic type such as an aliphatic diamine and a siloxane type diamine.

There is no particular restriction on a compound having isocyanate groups, insofar as it has two or more isocyanate groups in a molecule, and a publicly known compound may be selected. Examples of the compound may include such low molecular weight compounds as represented by p-phenylene diisocyanate, 2,4-toluene diisocyanate, 2,6-toluene diisocyanate, 1,5-naphthalene diisocyanate, and hexamethylene diisocyanate. Other specific examples of the compound may include a polymer with the weight average molecular weight of 3,000 or higher, having isocyanate groups at a side chain or a terminus.

In the case where the compound having the isocyanate groups is used as an anionic polymerizable resin, it is generally used in combination with a compound having two or more hydroxy groups in the molecule. There is no particular restriction on the compound having hydroxy groups, and a publicly known compound may be selected. Specific examples thereof may include such low molecular weight compounds as represented by ethylene glycol, propylene glycol, glycerin, diglycerin and pentaerythritol. Other specific examples of the compound may include a polymer with the weight average molecular weight of 3,000 or higher, having hydroxy groups at a side chain or terminus. The compound having two or more hydroxy groups in the molecule is preferably used with respect to the compound with the isocyanate groups at a ratio of 0.5/1.5 to 1.5/0.5 according to (total amount of the hydroxy group)/(total amount of the isocyanate group) (by equivalent), and more preferably used at a ratio of 0.8/1.2 to 1.2/0.8. When the photocurable resin composition contains the compound at the specified ratio, the curability tends to be improved further.

The content of the photobase generator in the photocurable resin composition of the Embodiment is preferably 0.001 to 100 parts by mass based on 100 parts by mass of an anionic polymerizable resin, and more preferably 0.005 to 80 parts by mass. In the case where the content of the photobase generator is in the range, the properties of the cured product can result in being superior.

The photocurable resin composition of the Embodiment may include further an organic solvent as needed. There is no particular restriction on an organic solvent, and examples thereof may include such an ether, as represented by diethyl ether, tetrahydrofuran, dioxane, ethylene glycol dimethyl ether, ethylene glycol diethyl ether, propylene glycol dimethyl ether, and propylene glycol diethyl ether; a glycol monoether (also called as cellosolve), as represented by ethylene glycol monomethyl ether, ethylene glycol monoethyl ether, propylene glycol monomethyl ether, propylene glycol monoethyl ether, diethylene glycol monomethyl ether, and diethylene glycol monoethyl ether; a ketone, as represented by methyl ethyl ketone, acetone, methyl isobutyl ketone, cyclopentanone, and cyclohexanone; an ester, as ethyl acetate, butyl acetate, n-propyl acetate, i-propyl acetate, n-butyl acetate, i-butyl acetate, acetate of the aforedescribed glycol monoether (e.g. methyl cellosolve acetate and ethyl cellosolve acetate), methoxypropyl acetate, ethoxypropyl acetate, dimethyl oxalate, methyl lactate and ethyl lactate; an alcohol, as represented by methanol, ethanol, isopropanol, propanol, butanol, hexanol, cyclohexanol, ethylene glycol, diethylene glycol, and glycerin; a halogenated hydrocarbon, as represented by methylene chloride, 1,1-dichloroethane, 1,2-dichloroethylene, 1-chloropropane, 1-chlorobutane, 1-chloropentane, chlorobenzene, bromobenzene, o-dichlorobenzene, and m-dichlorobenzene; an amide, as represented by N,N-dimethylformamide, and N,N-dimethylacetamide; a pyrrolidone, as represented by N-methylpyrrolidone; a lactone, as represented by γ-butyrolactone; a sulfoxide, as represented by dimethyl sulfoxide; a chain or a cyclic saturated hydrocarbon, as represented by hexane, cyclohexane and heptane; and other organic polar solvents. Further examples of the organic solvent may include such an aromatic hydrocarbon, as represented by benzene, toluene and xylene; and other organic nonpolar solvents. The organic solvents may be used alone or in combination of two or more kinds.

The photocurable resin composition of the Embodiment may include further a publicly known inorganic filler as needed in order to improve various properties, such as adhesiveness between the cured product and a substrate, or the hardness of the cured product. Examples thereof may include barium sulfate, barium titanate, silicon oxide powder, silicon oxide micropowder, amorphous silica, talc, clay, magnesium carbonate, calcium carbonate, aluminum oxide, aluminum hydroxide, and mica powder.

Furthermore, the photocurable resin composition of the Embodiment may include further publicly known additives, such as a publicly known colorant, as represented by phthalocyanine blue, phthalocyanine green, iodine green, disazo yellow, crystal violet, titanium dioxide, carbon black and naphthalene black; a publicly known polymerization inhibitor, as represented by hydroquinone, hydroquinone monomethyl ether, tert-butylcatechol, pyrogallol and phenothiazine; a publicly known thickener, as represented by asbestos, "Orben", "Bentone" and montmorillonite; a defoaming agent and/or a leveling agent of a silicone type, a fluorine type and a polymer type; an adhesion promoter, as represented by an imidazole type, a thiazole type, a triazole type and a silane coupling agent; as well as a hindered phenol type antioxidant, and a hindered amine type light stabilizer (HALS).

The photocurable resin composition of the Embodiment may include, as needed, one or more publicly known photo radical initiators, such as benzophenone, a benzophenone derivative, acetophenone and an acetophenone derivative.

The photocurable resin composition of the Embodiment is cured by being subjected to photoirradiation only; to photoirradiation and heating simultaneously; or after photoirradiation to heating. The photoirradiation is preferably conducted with light in the wavelength range of 150 to 750 nm. More specifically, the photocurable resin composition can be cured by photoirradiation using a low-pressure mercury lamp, a medium-pressure mercury lamp, a high-pressure mercury lamp, a super high-pressure mercury lamp, a xenon lamp and/or a metal halide lamp at an irradiation amount of 0.01 to 100 J/cm$^2$. The photoirradiation is preferably conducted with the light in the wavelength range of 200 to 400 nm at an irradiation amount of 0.05 to 20 J/cm$^2$. There is no particular restriction on the temperature for the possible heating, insofar as it is below the decomposition temperature of the anionic polymerizable resin. Preferably the temperature is 30 to 400° C., and more preferably 50 to 300° C. In the case of heating is carried out, for the sake of adequate curing, the heating time is preferably 1 sec to 3 hours, and more preferably 30 sec to 1 hour.

Pattern formation can be conducted with the photocurable resin composition of the Embodiment. A method for forming a pattern is for example as follows. That is, the photocurable resin composition is coated on a substrate to form a coat or a formed body, onto the surface of which light is irradiated with a certain pattern by means of a photomask, etc. The irradiated portion of the coat or the formed body (irradiated region) is cured to form a latent image. The photo-irradiated coat or formed body is subjected to an after-treatment such as heat treatment as need, to lower selectively the solubility of the irradiated region of the coat or the formed body. Then, the not-irradiated region of the coat or formed body is selectively removed using a developing liquid, such as an aqueous solution or an organic solvent, to form the pattern.

There is no particular restriction on a method for coating the photocurable resin composition of the Embodiment onto a substrate. Specific examples thereof may include such publicly known methods, as represented by a flexo printing method, a gravure printing method, an offset printing method, a gravure offset printing method, a screen printing method, an ink-jet method, a spray method, a spin coat method, a roll-coating method, an electrostatic coating method and a curtain coating method.

The photoirradiation and heating with respect to the coat or formed body obtained by coating the photocurable resin composition of the Embodiment onto a substrate should be conducted as described above.

There is no particular restriction on a developing liquid which is used for selectively removing the not-irradiated region of the coat or formed body, and examples thereof may include a basic aqueous solution, an organic solvent, an acidic aqueous solution and a neutral aqueous solution. The developing liquid may be selected appropriately depending on a curable component such as a polymeric precursor contained in the photocurable resin composition.

Although there is no particular restriction on a basic aqueous solution, examples thereof may include an aqueous solution of tetramethylammonium hydroxide (TMAH), an aqueous solution of potassium hydroxide, an aqueous solution of sodium hydroxide, an aqueous solution of magnesium hydroxide, an aqueous solution of calcium hydroxide, an aqueous solution of sodium hydrogen carbonate, an aqueous solution of a primary, secondary and tertiary amine, and an aqueous solution of a hydroxide ion and an ammonium ion. The alkali concentration in the basic aqueous solution is preferably 0.01 mass % to 10 mass %, and more preferably 0.05 mass-% to 5 mass %. The solute to be contained in the basic aqueous may be used alone or a combination of two or more kinds. The content is preferably 50% (by mass) or more of the total, and more preferably 70% mass) or more. The basic aqueous solution should contain water, and may further contain a solvent other than water, for example an organic solvent. The basic aqueous solutions are used alone or in combination of two or more kinds.

Although there is no particular restriction on an organic solvent to be used as a developing liquid, and examples thereof may include such an ether, as represented by diethyl ether, tetrahydrofuran, dioxane, ethylene glycol dimethyl ether, ethylene glycol diethyl ether, propylene glycol dimethyl ether, and propylene glycol diethyl ether; a glycol monoether (also called as cellosolve), as represented by ethylene glycol monomethyl ether, ethylene glycol monoethyl ether, propylene glycol monomethyl ether, propylene glycol monoethyl ether, diethylene glycol monomethyl ether, and diethylene glycol monoethyl ether; a ketone, as represented by methyl ethyl ketone, acetone, methyl isobutyl ketone, cyclopentanone, and cyclohexanone; an ester, as represented by ethyl acetate, butyl acetate, n-propyl acetate, i-propyl acetate, n-butyl acetate, i-butyl acetate, acetate of the aforedescribed glycol monoether (e.g. methyl cellosolve acetate and ethyl cellosolve acetate), methoxypropyl acetate, ethoxypropyl acetate, dimethyl oxalate, methyl lactate and ethyl lactate; an alcohol, as represented by methanol, ethanol, isopropanol, propanol, butanol, hexanol, cyclohexanol, ethylene glycol, diethylene glycol, and glycerin; a halogenated hydrocarbon, as represented by methylene chloride, 1,1-dichloroethane, 1,2-dichloroethylene, 1-chloropropane, 1-chlorobutane, 1-chloropentane, chlorobenzene, bromobenzene, o-dichlorobenzene, and m-dichlorobenzene; an amide, as represented by N,N-dimethylformamide, and N,N-dimethylacetamide; a pyrrolidone, as represented by N-methylpyrrolidone; a lactone, as represented by γ-butyrolactone; a sulfoxide, as represented by dimethyl sulfoxide; a cyclic or non-cyclic saturated hydrocarbon, as represented by hexane, cyclohexane and heptane; and other organic polar solvents. Further examples of the organic solvent may include such an aromatic hydrocarbon, as represented by benzene, toluene and xylene; and other organic nonpolar solvents. The organic solvents may be used alone or in combination of two or more kinds.

In order to obtain a better pattern shape the organic solvent may be combined with a water, a basic aqueous solution and/or an acidic aqueous solution and used as a mixed solvent.

There is no particular restriction on an acidic aqueous solution, insofar as the pH of a solution is below 7. Examples of an acidic aqueous solution may include an aqueous solution of an organic acid, as represented by lactic acid, acetic acid, oxalic acid and malic acid, and aqueous solutions of hydrochloric acid, sulfuric acid, nitric acid, and phosphoric acid.

The photocurable resin composition of the Embodiment can be applied to uses in a wide variety of fields and products, such as a paint, an adhesive as a conductive adhesive, an ink as represented by a printing ink, a resist material for photoresist or solder mask, a coverlay, a coating material, various automobile parts, an electrical and electronic material, a semiconductor apparatus, a semiconductor material, a semiconductor encapsulation material, a semiconductor liquid-phase molding material, a die bonding material, an underfilling material, an optical material, an optical fiber, an adhesive for an optical fiber, an optical waveguide material, an optical circuit component, a color filter, a film for flexible display, a liquid crystal sealing material, an LED encapsulation material, an organic EL sealing material, an interlayer insulating film, a wire coating film, an antireflection coat, a hologram, a construction material, three-dimensional modeling, a filler, and a molding material. The composition of the photocurable resin composition of the Embodiment is adjusted for the required properties of an application, such as heat resistance, dimensional stability and insulation property.

Particularly concerning the adhesive application, the photocurable resin composition of the Embodiment can be applied not only to an adhesive for bonding wood, a construction material, plastic or leather, but also to a bonding material for a semiconductor element, such as an anisotropically conductive adhesive, a circuit connecting material, as represented by a silver paste or a silver film, and an anisotropically conductive material for a flip chip technique, by which a semiconductor element represented by a flip chip is bonded with a printed wiring board.

EXAMPLES

The present invention will now be described in more detail by way of examples thereof, provided that the present invention is not limited thereto.

Example 1

In 25 mL of pyridine was dissolved 7.6 g (62.2 mmol) of tropolone (manufactured by Wako Pure Chemical Industries, Ltd.) to obtain a solution, to which 12.5 g (65.4 mmol) of p-toluenesulfonyl chloride was added, followed by stirring at room temperature for 20 hours. After adding 200 mL of water, the mixture was stirred adequately and then subjected to suction filtration, washing with water and drying in the order mentioned, to obtain a tosylated product of tropolone as a solid matter (yield amount 13.5 g, yield rate 79%). With 1.65 g (6 mmol) of the obtained tosylated product were mixed 50 mL of ethanol and 1.4 g (18 mmol) of a 40 mass % aqueous solution of methylamine, and the mixture was heated at reflux for 2 hours. After refluxing, ethanol was removed from the solution by distillation under a reduced pressure, to which 20 mL of water and 2 mL of a saturated aqueous solution of $NaHCO_3$ were added, and the mixture was stirred, and then extracted twice by 30 mL of diethyl ether. $MgSO_4$ was added to the obtained diethyl ether extract, which was then dried and filtrated, and then diethyl ether was removed by distillation under a reduced pressure to obtain a photobase generator of 2-methylaminotropone as a yellow solid. The yield amount was 0.63 g (yield rate 78%).

Seventy (70) parts by mass of a bisphenol-A type epoxy resin (Trade name "AER250" manufactured by Asahi Kasei Chemicals Corporation), 30 parts by mass of pentaerythritol tetrakis(mercaptoacetate) (manufactured by Wako Pure Chemical Industries, Ltd.) and 10 parts by mass of 2-methylaminotropone synthesized according to the aforedescribed method were mixed to obtain a photocurable resin composition. The obtained photocurable resin composition was coated on a glass plate to form a 100 μm-thick coat. The coat was irradiated by ultraviolet rays (wavelength: 365 nm) in a nitrogen atmosphere at 9 $J/cm^2$ so that a curing reaction proceeded to yield a semi-solid film. The semi-solid film was heated at 120° C. for 10 min to cure completely yielding a robust solid film (cured film). In the process of the photoirradiation and heat-curing, gas generation was not confirmed, and a uniform solid film was obtained.

(Basicity Evaluation)

A cyclohexane solution (1 mass %) of 2-methylaminotropone obtained as above was irradiated by ultraviolet rays (wavelength: 365 nm) in a nitrogen atmosphere at 9 $J/cm^2$. After removing cyclohexane by distillation under a reduced pressure, ion-exchanged water was added to the mixture to obtain a 0.01 mol/L aqueous solution. The pH of the obtained aqueous solution was measured by a pH meter (Trade name "HM-30G" manufactured by DKK-TOA Corporation). As the result, the pH of 8.2 before the irradiation of the ultraviolet rays was increased to 9.0 after the irradiation of the ultraviolet rays, demonstrating increase of the basicity.

(Molecular Weight Evaluation)

A cyclohexane solution (1 mass %) of 2-methylaminotropone obtained as above was irradiated by ultraviolet rays (wavelength: 365 nm) in a nitrogen atmosphere at 9 $J/cm^2$. The molecular weights before and after the irradiation of the ultraviolet rays were measured by a mass spectrometer (Trade name "MALDI-TOF/MAS, AXIMA CFR plus", manufactured by Shimadzu Corporation). As the result, m/z=136 ($[M+H]^+$) was obtained for both before and after the irradiation of the ultraviolet rays, demonstrating that the molecular species had the same molecular weight.

Example 2

To a solution prepared by dissolving 5.1 g (31.1 mmol) of 4-isopropyltropolone (also called as hinokitiol, manufactured by Asahi Kasei Finechem Co., Ltd.) in 12 mL of pyridine, 6.24 g (32.7 mmol) of p-toluenesulfonyl chloride was added followed by stirring at room temperature for 4 hours. After adding 80 mL of water and 11 mL of concentrated hydrochloric acid in the order mentioned, the mixture was stirred adequately and extracted twice by 30 mL of diethyl ether. MgSO$_4$ was added to the obtained diethyl ether extract, which was then dried and filtrated, and then diethyl ether was removed by distillation under a reduced pressure to obtain a tosylated product of 4-isopropyltropolone (yield amount 7.6 g, yield rate 77%). With 1.9 g (6 mmol) of the obtained tosylated product were mixed 50 mL of ethanol and 1.4 g (18 mmol) of a 40 mass % aqueous solution of methylamine, and the mixture was heated at reflux for 2 hours. After refluxing, ethanol was removed from the solution by distillation under a reduced pressure, to which 20 mL of water and 2 mL of a saturated aqueous solution of NaHCO$_3$ were added, and the mixture was stirred, then extracted twice by 20 mL/20 mL of diethyl ether/ethyl acetate. MgSO$_4$ was added to the obtained diethyl ether/ethyl acetate extract, which was then dried and filtrated, and then diethyl ether/ethyl acetate were removed by distillation under a reduced pressure to obtain a photobase generator of methylaminoisopropyltrone (a mixture of 2-methylamino-4-isopropyltropone and 2-methylamino-6-isopropyltropone). The yield amount was 0.98 g (yield rate 92%).

Seventy (70) parts by mass of a bisphenol-A type epoxy resin (Trade name "AER250" manufactured by Asahi Kasei Chemicals Corporation), 30 parts by mass of pentaerythritol tetrakis(mercaptoacetate) (manufactured by Wako Pure Chemical Industries, Ltd.) and 10 parts by mass of methylaminoisopropyltrone synthesized according to the aforedescribed method were mixed to obtain a photocurable resin composition. The obtained photocurable resin composition was coated on a glass plate to form a 100 μm-thick coat. The coat was irradiated by ultraviolet rays (wavelength: 365 nm) in a nitrogen atmosphere at 6 J/cm$^2$ so that a curing reaction proceeded to yield a semi-solid film. The semi-solid film was heated at 120° C. for 10 min to cure completely yielding a robust solid film (cured film). In the process of the photoirradiation and heat-curing, gas generation was not confirmed, and a uniform solid film was obtained.

(Basicity Evaluation)

A cyclohexane solution (1 mass %) of methylaminoisopropyltrone obtained as above was irradiated by ultraviolet rays (wavelength: 365 nm) in a nitrogen atmosphere at 6 J/cm$^2$. After removing cyclohexane by distillation under a reduced pressure, ion-exchanged water was added to the mixture to obtain a 0.01 mol/L aqueous solution. The pH of the obtained aqueous solution was measured by a pH meter (Trade name "HM-30G" manufactured by DKK-TOA Corporation). As the result, the pH of 8.4 before the irradiation of the ultraviolet rays was increased to 9.1 after the irradiation of the ultraviolet rays, demonstrating increase of the basicity.

(Molecular Weight Evaluation)

A cyclohexane solution (1 mass %) of methylaminoisopropyltrone obtained as above was irradiated by ultraviolet rays (wavelength: 365 nm) in a nitrogen atmosphere at 6 J/cm$^2$. The molecular weights before and after the irradiation of the ultraviolet rays were measured by a mass spectrometer (Trade name "MALDI-TOF/MAS, AXIMA CFR plus", manufactured by Shimadzu Corporation). As the result, m/z=178 ([M+H]$^+$) was obtained for both before and after the irradiation of the ultraviolet rays, demonstrating that the molecular species had the same molecular weight.

Reference Example 1

Seventy (70) parts by mass of a bisphenol-A type epoxy resin (Trade name "AER250" manufactured by Asahi Kasei Chemicals Corporation), 30 parts by mass of pentaerythritol tetrakis(mercaptoacetate) (manufactured by Wako Pure Chemical Industries, Ltd.) and 10 parts by mass of 2-methylaminotropone synthesized as in Example 1 were mixed to obtain a resin composition. The obtained resin composition was coated on a glass plate to form a 100 μm-thick coat. Without being irradiated by ultraviolet rays, the coat was heated at 120° C. for 30 min. Curing of the coat was not observed.

Reference Example 2

Seventy (70) parts by mass of a bisphenol-A type epoxy resin (Trade name "AER250" manufactured by Asahi Kasei Chemicals Corporation), 30 parts by mass of pentaerythritol tetrakis(mercaptoacetate) (manufactured by Wako Pure Chemical Industries, Ltd.) and 10 parts by mass of methylaminoisopropyltrone synthesized as in Example 2 were mixed to obtain a resin composition. The obtained resin composition was coated on a glass plate to form a 100 μm-thick coat. Without being irradiated by ultraviolet rays, the coat was heated at 120° C. for 30 min. Curing of the coat was not observed.

Comparative Example 1

Seventy (70) parts by mass of a bisphenol-A type epoxy resin (Trade name "AER250" manufactured by Asahi Kasei Chemicals Corporation), 30 parts by mass of pentaerythritol tetrakis(mercaptoacetate) (manufactured by Wako Pure Chemical Industries, Ltd.) and 10 parts by mass of N-(2-nitrobenzyloxycarbonyl)pyrrolidine synthesized according to a publicly known method were mixed to obtain a resin composition. The obtained resin composition was coated on a glass plate to form a 100 μm-thick coat. The coat was irradiated by ultraviolet rays (wavelength: 365 nm) in a nitrogen atmosphere at 6 J/cm$^2$ and heated at 120° C. for 10 min. Although curing of the coat was confirmed, generation of a bubble in the cured solid film was confirmed, and a uniform solid film was not obtained.

Example 3

Fifty (50) parts by mass of a epoxy resin (Trade name "SR-TMP" manufactured by Sakamoto Yakuhin Kogyo Co., Ltd.), 50 parts by mass of pentaerythritol tetrakis(mercaptoacetate) (manufactured by Wako Pure Chemical Industries, Ltd.) and 10 parts by mass of N-methyl-2-cyanopyrrole, which was a photobase generator synthesized according to a publicly known method, were mixed to obtain a photocurable resin composition. The obtained photocurable resin composition was coated on a glass plate to form a 100 μm-thick coat. The coat was irradiated by ultraviolet rays (wavelength: 254 nm) in a nitrogen atmosphere at 9 J/cm$^2$ so that a curing reaction proceeded to yield a semi-solid film. The semi-solid film was heated at 120° C. for 10 min to cure completely yielding a robust solid film (cured film). In the process of the photoirradiation and heat-curing, gas generation was not confirmed, and a uniform solid film was obtained.

The pH of the methanol solution (0.01 mol/L) of N-methyl-2-cyanopyrrole obtained as above measured 6.6. The solution was filled into a quartz cell (10 mm×10 mm×45 mm, optical path length: 10 mm). The cell was irradiated by ultraviolet rays with wavelength of 254 nm at 7.8 J/cm$^2$. The pH measured for the solution after ultraviolet irradiation was increased to 8.2, and expression of the basicity was confirmed. The measurement of the pH was conducted after 8-fold dilution of the solution with ion-exchanged water by using a pH meter (Trade name "HM-30G" manufactured by DKK-TOA Corporation).

Example 4

Fifty (50) parts by mass of an epoxy resin (Trade name "SR-TMP" manufactured by Sakamoto Yakuhin Kogyo Co., Ltd.), 25 parts by mass of pentaerythritol tetrakis(mercaptoacetate) (manufactured by Wako Pure Chemical Industries, Ltd.), 50 parts by mass of a 50 mass % ethanol solution of a cresol novolac resin (Trade name "EPR5030G" manufactured by Asahi Organic Chemicals Industry Co., Ltd.), 10 parts by mass of methylaminoisopropyltropone, which was a photobase generator synthesized according to a similar method as in Example 2, 30 parts by mass of precipitated barium sulfate (Trade name "B-54" manufactured by Sakai Chemical Industry Co., Ltd.), 2.5 parts by mass of anhydrous silica (Trade name "Aerosil 380" manufactured by Nippon Aerosil Co., Ltd.) and 0.7 parts by mass of phthalocyanine green (manufactured by Tokyo Chemical Industry Co., Ltd.) were mixed to obtain a photocurable resin composition. The obtained photocurable resin composition was coated on a glass plate to form a 100 μm-thick coat. The coat was dried at 60° C. for 5 min, and then irradiated, through a photomask depicted with certain letters, by ultraviolet rays (wavelength: 365 nm) in a nitrogen atmosphere at 9 J/cm$^2$ to form a latent image. The coat with the formed latent image was heated at 120° C. for 3 min to cure the portion of the latent image completely, developed by a 0.26 N aqueous solution of sodium hydroxide, then washed with water and dried. Thus a pattern was formed, on which the letters depicted on the photomask were engraved sharply forming a negative. In the process of the photoirradiation and heating, gas generation was not confirmed, and a uniform robust pattern was obtained.

Comparative Example 2

Except that N-(2-nitrobenzyloxycarbonyl)pyrrolidine used in Comparative Example 1 was used instead of methylaminoisopropyltropone, a pattern was formed identically as in Example 4. In the pattern, generation of a bubble was confirmed, and the flatness of thereof was deteriorated and the engraved letters were unclear.

Example 5

In 5 mL of dehydrated N-methyl-2-pyrrolidone (NMP) was dissolved 1.20 g (6 mmol) of 4,4'-diaminodiphenyl ether, to which 1.31 g (6 mmol) of pyromellitic dianhydride was added in a nitrogen atmosphere under stirring while being cooled on ice. The mixture was further stirred on ice for 5 hours, and dehydrated diethyl ether was added thereto. Solid precipitate was filtrated and dried at room temperature under a reduced pressure for 20 hours to obtain 2.0 g of a polyimide precursor as a white solid.

In 3 mL of the NMP were dissolved 400 mg of the obtained polyimide precursor and 80 mg of methylaminoisopropyltropone, which was a photobase generator synthesized according to a method as in Example 2, to obtain a photocurable resin composition. The obtained photocurable resin composition was so coated on a glass plate forming a coat, that the thickness of a pattern became 2 μm. The coat was dried with a hot plate at 80° C. for 30 min, and then irradiated, through a photomask depicted with certain letters, by ultraviolet rays (wavelength: 365 nm) in a nitrogen atmosphere at 5 J/cm$^2$ to form a latent image. The coat with the formed latent image was heated at 160° C. for 5 min, developed by a 2.38 mass % aqueous solution of tetramethylammonium hydroxide, and then heated at 300° C. for 1 hour for imidization. Thus a pattern was formed, on which the letters depicted on the photomask were engraved sharply forming a negative. In the process of the photoirradiation and heating, gas generation was not confirmed, and a uniform robust pattern was obtained.

Example 6

Except that 2-aminotropone synthesized by a publicly known method was used instead of 2-methylaminotropone, a photocurable resin composition was obtained identically as in Example 1. The obtained photocurable resin composition was coated on a glass plate to form a 100 μm-thick coat. The coat was irradiated by ultraviolet rays (wavelength: 365 nm) in a nitrogen atmosphere at 9 J/cm$^2$ so that a curing reaction proceeded to yield a semi-solid film. The semi-solid film was heated at 120° C. for 20 min to cure completely yielding a robust solid film (cured film). In the process of the photoirradiation and heat-curing, gas generation was not confirmed, and a uniform solid film was obtained.

Example 7

Except that 2-acetylaminotropone synthesized by a publicly known method was used instead of 2-methylaminotropone, a photocurable resin composition was obtained identically as in Example 1. The obtained photocurable resin composition was coated on a glass plate to form a 100 μm-thick coat. The coat was irradiated by ultraviolet rays (wavelength: 365 nm) in a nitrogen atmosphere at 9 J/cm$^2$ so that a curing reaction proceeded to yield a semi-solid film. The semi-solid film was heated at 120° C. for 30 min to cure completely yielding a robust solid film (cured film). In the process of the photoirradiation and heat-curing, gas generation was not confirmed, and a uniform solid film was obtained.

Example 8

Using isopropylamine instead of methylamine, a photobase generator of 2-isopropylamino tropolone was synthesized similarly as in Example 1. Except that such 2-isopropylamino tropolone was used instead of 2-methylaminotropone, a photocurable resin composition was obtained identically as in Example 1. The obtained photocurable resin composition was coated on a glass plate to form a 100 μm-thick coat. The coat was irradiated by ultraviolet rays (wavelength: 365 nm) in a nitrogen atmosphere at 9 J/cm$^2$ so that a curing reaction proceeded to yield a semi-solid film. The semi-solid film was heated at 120° C. for 20 min to cure completely yielding a robust solid film (cured film). In the process of the photoirradiation and heat-curing, gas generation was not confirmed, and a uniform solid film was obtained.

Example 9

Except that pentaerythritol tetrakis(mercaptoacetate) was not added, a photocurable resin composition was obtained identically as in Example 1. The obtained photocurable resin composition was coated on a glass plate to form a 100 μm-thick coat. The coat was irradiated by ultraviolet rays (wavelength: 365 nm) in a nitrogen atmosphere at 9 J/cm$^2$ so that a curing reaction proceeded to yield a semi-solid film. The semi-solid film was heated at 120° C. for 30 min to cure completely yielding a robust solid film (cured film). In the process of the photoirradiation and heat-curing, gas generation was not confirmed, and a uniform solid film was obtained.

Example 10

Except that a cresol novolac resin was not added, a photocurable resin composition was obtained identically as in Example 4. The obtained photocurable resin composition was coated on a glass plate to form a 100 µm-thick coat. The coat was dried at 60° C. for 5 min, and then irradiated, through a photomask depicted with certain letters, by ultraviolet rays (wavelength: 365 nm) in a nitrogen atmosphere at 9 J/cm² to form a latent image. The coat with the formed latent image was heated at 120° C. for 15 min to cure the portion of the latent image completely, developed by a 0.26 N aqueous solution of sodium hydroxide, then washed with water and dried. Thus a pattern was formed, on which the letters depicted on the photomask were engraved sharply forming a negative. In the process of the photoirradiation and heating, gas generation was not confirmed, and a uniform robust pattern was obtained.

Comparative Example 3

Except that N-(2-nitrobenzyloxycarbonyl)pyrrolidine used in Comparative Example 1 was used instead of methylaminoisopropyltropone, a pattern was formed identically as in Example 5. In the pattern generation of a bubble was confirmed, and the flatness of thereof was deteriorated and the engraved letters were unclear.

INDUSTRIAL APPLICABILITY

The present invention can be usable for a photobase generator suitable for photocuring an anionic curable resin, such as an epoxy resin and a polyimide resin, and a photocurable resin composition containing the same. More particularly, the present invention is usable for a photobase generator, which can express or increase basicity while adequately suppressing production of unnecessary byproducts such as a gas or water, and is especially useful for curing a resin for electronic materials requiring stringently high degree of insulation reliability, heat resistance and micro-fabricability; as well as for a photocurable resin composition containing the same.

The invention claimed is:

1. The photobase generator comprising a compound having a nitrogen atom and a conjugated double bond, wherein the compound comprises at least either of compounds represented by the following general formulas (3) and (4);

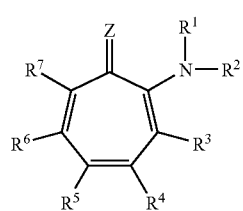

(3)

wherein $R^1$ and $R^2$ each independently represent a hydrogen atom, an alkyl group, an alkenyl group, a cycloalkyl group, an aralkyl group, or an aryl group; $R^3$, $R^4$, $R^5$, $R^6$ and $R^7$ each independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen group, or an amino group; $R^1$, $R^2$, $R^3$, $R^4$, $R^5$, $R^6$ and $R^7$, at least two of which may bond together to form a saturated or an unsaturated ring, may each independently be substituted with a monovalent group formed by removing a hydrogen atom from the compound represented by the formula (3) or (4); and Z represents an oxygen atom or a sulfur atom;

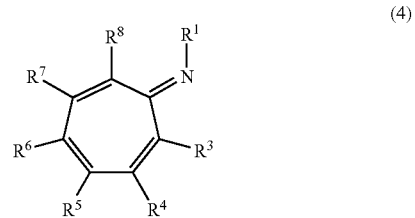

(4)

wherein $R^1$ represents a hydrogen atom, an alkyl group, an alkenyl group, a cycloalkyl group, an aralkyl group, or an aryl group; $R^3$, $R^4$, $R^5$, $R^6$, $R^7$ and $R^8$ each independently represent a hydrogen atom, a carboxyl group, an alkoxycarbonyl group, a cyano group, a formyl group, an acyl group, a nitro group, a nitroso group, an alkyl group, an alkenyl group, a cycloalkyl group, an aralkyl group, an aryl group, a hydroxy group, a mercapto group, an alkylthioether group, an alkoxy group, a halogen group, or an amino group; R', $R^2$, $R^3$, $R^4$, $R^5$, $R^6$, $R^7$ and $R^8$, at least two of which may bond together to form a saturated or an unsaturated ring, may each independently be substituted with a monovalent group formed by removing a hydrogen atom from the compound represented by the formula (3) or (4).

2. The photobase generator according to claim 1, wherein the Z represents an oxygen atom.

3. The photobase generator according to claim 1, wherein the $R^1$, $R^2$, $R^3$, $R^4$, $R^5$, $R^6$, $R^7$ and $R^8$ each independently represent a hydrogen atom, an alkyl group, an alkenyl group, a cycloalkyl group, an aralkyl group, or an aryl group.

4. The photobase generator according to claim 1, wherein the $R^1$ and/or $R^2$ represent(s) an alkyl group, an alkenyl group, a cycloalkyl group, an aralkyl group, or an aryl group.

5. The photobase generator according to claim 1, wherein the $R^1$ represents a methyl group, the $R^2$ represents a hydrogen atom, and the $R^3$, $R^4$, $R^5$, $R^6$, $R^7$ and $R^8$ each independently represent a hydrogen atom or an isopropyl group.

6. A photocurable resin composition comprising 100 parts by mass of an anionic polymerizable resin; and 0.001 to 100 parts by mass of the photobase generator according to claim 1.

7. The photocurable resin composition according to claim 6, wherein the anionic polymerizable resin is an epoxy resin.

8. The photocurable resin composition according to claim 7, further comprising a polythiol.

9. The photocurable resin composition according to claim 7, further comprising a phenolic resin.

* * * * *